United States Patent
Sun et al.

(10) Patent No.: US 7,077,725 B2
(45) Date of Patent: Jul. 18, 2006

(54) ADVANCED ELECTROLYTIC POLISH (AEP) ASSISTED METAL WAFER PLANARIZATION METHOD AND APPARATUS

(75) Inventors: Lizhong Sun, Sunnyvale, CA (US); Stan Tsai, Fremont, CA (US); Fritz Redeker, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 791 days.

(21) Appl. No.: 09/949,275

(22) Filed: Sep. 7, 2001

(65) Prior Publication Data
US 2004/0050817 A1 Mar. 18, 2004

Related U.S. Application Data (62) Division of application No. 09/450,858, filed on Nov. 29, 1999, now Pat. No. 6,299,741.

(51) Int. Cl.
*B24B 1/00* (2006.01)

(52) U.S. Cl. .......................... 451/41; 451/57; 205/222; 438/69.2; 156/345.12

(58) Field of Classification Search .................. 451/41, 451/57; 441/74; 205/222; 252/514; 428/209, 428/606; 438/692–693; 156/345.12
See application file for complete search history.

(56) References Cited

U.S. PATENT DOCUMENTS

| | | |
|---|---|---|
| 3,162,588 A | 12/1964 | Bell |
| 3,448,023 A | 6/1969 | Bell |
| 4,396,467 A | 8/1983 | Anthony |
| 4,466,864 A | 8/1984 | Bacon et al. |

(Continued)

FOREIGN PATENT DOCUMENTS

| | | |
|---|---|---|
| EP | 0455455 | 11/1991 |
| EP | 0738561 | 10/1996 |

(Continued)

OTHER PUBLICATIONS

Partial European Search Report for EP 00 31 0560, dated Dec. 12, 2003. Reference No. 56125000/EA6968.
Contolini et al, Electrochemical planarization of ULSI copper, Solid State Technology, Jun. 1997, pp. 155–161, vol. 40, No. 6, Cowan Pub. Corp., Washington, USA.

(Continued)

*Primary Examiner*—George Nguyen
(74) *Attorney, Agent, or Firm*—Patterson & Sheridan (57) ABSTRACT

In advanced electrolytic polish (AEP) method, a metal wafer (10) acts as an anodic electrodes and another metal plate (65) is used as a cathodic electrode. A voltage differential is applied to the anode and cathode under a predetermined anodic dissolution current density. This causes a reaction that provides a planarized surface on the metal wafers. Additives are included in the electrolyte solution (55) which adsorb onto the wafer surface urging a higher removal rate at higher spots and a lower removal rate at lower spots. Also, in another embodiment of the present invention is a pulsed-electrolytic process (260) in which positive and negative potentials are applied to the anodic and cathodic electrodes alternately, further encouraging surface planarization. AEP can be used either as a first step followed by a mechanical polish or a second step between initial CMP polish and a third step mechanical polish. The present invention may also be added as a last step of copper electroplating process and so may be used in the manufacture of all kinds of patterned metal wafers.

30 Claims, 6 Drawing Sheets

U.S. PATENT DOCUMENTS

| | | | |
|---|---|---|---|
| 4,496,436 A | | 1/1985 | Inoue |
| 4,720,280 A | * | 1/1988 | Hufnagl et al. ............... 441/74 |
| 4,789,437 A | | 12/1988 | Sing et al. |
| 4,839,005 A | | 6/1989 | Katsumoto et al. |
| 4,869,971 A | | 9/1989 | Nee et al. |
| 4,956,056 A | | 9/1990 | Zubatova et al. |
| 5,032,238 A | | 7/1991 | Ishimura et al. |
| 5,039,381 A | | 8/1991 | Mullarkey |
| 5,096,550 A | | 3/1992 | Mayer et al. |
| 5,114,548 A | | 5/1992 | Rhoades |
| 5,141,602 A | | 8/1992 | Chen et al. |
| 5,217,586 A | | 6/1993 | Datta et al. |
| 5,256,565 A | | 10/1993 | Bernhardt et al. |
| 5,340,370 A | | 8/1994 | Cadien et al. |
| 5,522,965 A | | 6/1996 | Chisholm et al. |
| 5,567,300 A | | 10/1996 | Datta et al. |
| 5,637,031 A | | 6/1997 | Chen |
| 5,637,185 A | | 6/1997 | Murarka et al. |
| 5,664,990 A | | 9/1997 | Adams et al. |
| 5,683,538 A | | 11/1997 | O'Neill et al. |
| 5,705,230 A | | 1/1998 | Matanabe et al. |
| 5,738,574 A | | 4/1998 | Tolles et al. |
| 5,807,165 A | | 9/1998 | Uzoh et al. |
| 5,827,435 A | | 10/1998 | Samukawa |
| 5,846,398 A | | 12/1998 | Carpio |
| 5,911,619 A | | 6/1999 | Uzoh et al. |
| 5,952,083 A | * | 9/1999 | Parthasarathi et al. ...... 428/209 |
| 5,972,192 A | | 10/1999 | Dubin et al. |
| 6,004,880 A | | 12/1999 | Liu et al. |
| 6,010,964 A | | 1/2000 | Glass |
| 6,027,630 A | | 2/2000 | Cohen |
| 6,056,864 A | * | 5/2000 | Cheung ..................... 205/222 |
| 6,066,030 A | * | 5/2000 | Uzoh ......................... 451/41 |
| 6,074,284 A | * | 6/2000 | Tani et al. .................... 451/57 |
| 6,090,239 A | * | 7/2000 | Liu et al. ............... 156/345.12 |
| 6,143,155 A | | 11/2000 | Adams et al. |
| 6,176,992 B1 | | 1/2001 | Talieh |
| 6,203,684 B1 | | 3/2001 | Taylor et al. |
| 6,234,870 B1 | | 5/2001 | Uzoh et al. |
| 6,242,343 B1 | * | 6/2001 | Yamazaki et al. .......... 438/633 |
| 6,248,222 B1 | | 6/2001 | Wang |
| 6,251,235 B1 | | 6/2001 | Talieh et al. |
| 6,258,220 B1 | | 7/2001 | Dordi et al. |
| 6,261,157 B1 | * | 7/2001 | Bajaj et al. .................... 451/57 |
| 6,261,433 B1 | | 7/2001 | Landau |
| 6,261,478 B1 | * | 7/2001 | Udaka ........................ 252/514 |
| 6,291,081 B1 | * | 9/2001 | Kurabe et al. .............. 428/606 |
| 6,299,741 B1 | | 10/2001 | Sun et al. .............. 204/224 M |
| 6,315,883 B1 | | 11/2001 | Mayer et al. |
| 6,328,872 B1 | | 12/2001 | Talieh et al. |
| 6,354,916 B1 | | 3/2002 | Uzoh et al. |
| 6,355,153 B1 | | 3/2002 | Uzoh et al. |
| 6,379,223 B1 | * | 4/2002 | Sun et al. ..................... 451/41 |
| 6,386,956 B1 | | 5/2002 | Sato et al. |
| 6,391,166 B1 | | 5/2002 | Wang |
| 6,395,152 B1 | | 5/2002 | Wang |
| 6,409,904 B1 | | 6/2002 | Uzoh et al. |
| 6,440,495 B1 | | 8/2002 | Wang |
| 6,471,847 B1 | | 10/2002 | Talieh et al. |
| 6,482,307 B1 | | 11/2002 | Ashjaee et al. |
| 6,497,800 B1 | | 12/2002 | Talieh et al. |
| 6,630,059 B1 | | 10/2003 | Uzoh et al. |
| 6,726,823 B1 | | 4/2004 | Wang et al. |
| 6,749,728 B1 | | 6/2004 | Wang |
| 2001/0035354 A1 | | 11/2001 | Ashjaee et al. |
| 2001/0036746 A1 | | 11/2001 | Sato et al. |
| 2001/0040100 A1 | | 11/2001 | Wang |
| 2001/0042690 A1 | | 11/2001 | Taliah |
| 2002/0008036 A1 | | 1/2002 | Wang |
| 2002/0011417 A1 | | 1/2002 | Taliah et al. |
| 2002/0020621 A1 | | 2/2002 | Uzoh et al. |
| 2002/0070126 A1 | | 6/2002 | Sato et al. |
| 2002/0072309 A1 | | 6/2002 | Sato et al. |
| 2002/0088715 A1 | | 7/2002 | Taliah et al. |
| 2002/0160698 A1 | | 10/2002 | Sato et al. |
| 2003/0104762 A1 | | 6/2003 | Sato et al. |
| 2003/0114004 A1 | | 6/2003 | Sato et al. |

FOREIGN PATENT DOCUMENTS

| | | |
|---|---|---|
| EP | 0905754 A2 | 3/1999 |
| JP | 53-37543 | 6/1978 |
| JP | 11238703 A1 | 8/1999 |
| JP | 2001-77117 | 3/2001 |
| WO | WO98/49723 | 11/1998 |
| WO | WO99/26758 | 6/1999 |
| WO | WO 99/53119 A1 | 10/1999 |
| WO | WO99/54527 | 10/1999 |
| WO | WO99/65072 A1 | 12/1999 |
| WO | WO00/03428 A1 | 1/2000 |
| WO | WO00/26443 | 5/2000 |
| WO | WO 00/33356 A2 | 6/2000 |
| WO | WO00/59682 | 10/2000 |
| WO | WO 01/88229 A1 | 11/2001 |
| WO | WO 02/23616 A1 | 3/2002 |

OTHER PUBLICATIONS

Yu et al., "Dishing effects in a chemical mechanical polishing planarization process for advanced trench isolation," Appl. Phys. Let. vol. 62 (11), Sep. 14, 1992, pp. 1344–46.

Gandikota et al., "Electrochemical Deposition for High Aspect Ratio Structures Using Electrical Pulse Modulation", filed May 11, 2000, U.S. Appl. No. 09/569,833.

Dordi, et al., "Electrodeposition Chemistry for Improved Filling of Apertures," filed Feb. 5, 1999, U.S. Appl. No. 09/245,780.

Nogami, Takeshi. "An Innovation to Integrate Porous Low–K Materials and Copper," Honeywell Seminar. Dec. 6, 2001.

Padhi, et al. "Planarization of Cooper Thin Films by Electropolishing in Phosphoric Acid for ULSI Applications" Journal of the Electrochemical Society, 150 (1) (2003) pp. G10–G14.

* cited by examiner

Figure 6

ADVANCED ELECTROLYTIC POLISH (AEP) ASSISTED METAL WAFER PLANARIZATION METHOD AND APPARATUS

CROSS-REFERENCE TO RELATED APPLICATIONS

This application is a divisional of U.S. utility application Ser. No. 09/450,858, U.S. Pat. No. 6,299,741, entitled, "An Advanced Electrolytic Polish (AEP) Assisted Metal Wafer Planarization Method and Apparatus" filed Nov. 29, 1999 by the present applicants.

FIELD OF THE INVENTION

This invention relates generally to planarization of metal substrates and more particularly to advanced electrolytic polishing of metal films on semiconductor wafers.

BACKGROUND OF THE INVENTION

Integrated circuits are typically formed on substrates, particularly silicon wafers, by the sequential deposition of conductive, semiconductive or insulative layers. After a layer is deposited, the layer is etched to create circuitry features. As a series of layers are sequentially deposited and etched, the outer or uppermost surface of the substrate, i.e., the exposed surface of the substrate, becomes increasingly non-planar. This non-planar outer surface presents a problem for the integrated circuit manufacturer. Therefore, there is a need to periodically planarize the substrate surface to provide a relatively flat surface. In some fabrication processes, planarization of the outer layer should not expose underlying layers.

Chemical mechanical polishing (CMP) is a current method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A fixed-abrasive pad has abrasive particles held in a containment media, whereas a standard pad has a durable surface, without embedded abrasive particles. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished and flat. The polishing rate, finish and flatness are determined by the pad and slurry combination, the relative speed between the substrate and pad, and the force pressing the substrate against the pad.

In applying conventional planarization techniques, such as CMP, it is extremely difficult to achieve a high degree of surface uniformity, particularly across a surface extending from a dense array of features, for example copper lines, bordered by an open field. A dense array of metal features is typically formed in an interlayer dielectric, such as silicon oxide layer, by a damascene technique wherein trenches are initially formed.

A barrier layer, such as a Ta-containing layer e.g. Ta, TaN, is then deposited lining the trenches and on the upper surface of the silicon oxide interlayer dielectric. Copper or a copper alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8000 Å to about 18,000 Å. In planarizing the wafer surface after copper metallization using CMP, undesirable erosion and dishing typically occur, decreasing the degree of surface uniformity or planarity and challenging the depth of focus limitations of conventional photolithographic techniques, particular with respect to achieving submicron dimensions, such as about 0.25 micron. Erosion is defined as the height differential between the oxide in the open field and the height of the oxide within the dense array. Dishing is defined as a difference in height between the oxide and Cu within the dense array.

Dishing and erosion formation are the most important parameters in evaluating metal CMP processes. Current processes using CMP generate at best 600–800 Å dishing and 400–1500 Å erosion, depending on the pattern density on the substrate. There are generally two causes for dishing formation: a) insufficient planarization and b) over-polish. CMP accomplishes planarization, but the efficiency of the planarization decreases significantly as the feature size increases on the substrate. Over-polish is performed to remove metal residue from a wafer's surface after CMP. Over-polish contributes significantly to dishing and erosion formation, especially when over-polish is done at a relatively high polish rate in order to have high throughput. Past efforts to improve dishing and erosion included modifications to the slurry, polishing pad and the process.

It remains desirable to have a process of planarization where dishing and erosion are decreased.

It is an advantage of the present invention to provide a method and apparatus for substrate planarization producing a good quality substrate surface with high throughput.

SUMMARY OF THE INVENTION

The problems of reducing dishing and erosion while achieving planarized processed substrates are solved by the present invention of an advanced electrolytic polish (AEP) assisted metal wafer planarization method and apparatus.

The advanced electrolytic polish (AEP) method polishes the metal surface of a layered substrate in a controlled way so that higher spots are removed more quickly than lower spots in the surface topography. AEP uses a reverse electroplating method along with surface modifying methods, either alone or in combination, to remove material from a substrate in order to planarize the substrate. A first surface modifying method is to include surface modifying additives in the electrolyte solution used for AEP. A second surface modifying method is pulsed electrolysis with application of alternating positive and negative potentials, in which the potential across the electrodes in AEP is periodically reversed causing high points on the substrate surface to be removed before low points on the substrate surface. Additives and pulsed electrolysis can be combined in an AEP process.

The polish in the present embodiment of the invention stops precisely at a barrier layer (tantalum, tantalum nitride, titanium or titanium nitride), however alteration of the electrolyte chemistry would alter the depth and the layers removed in the polish. Additives to the electrolyte solution, and the application of pulsed voltage during electrolytic polish further improve the planarity of the substrate polished surface.

In the AEP method herein described, substrates act as anodic electrodes and another metal plate is used as a cathodic electrode. The substrate and the cathode are configured in either an electroplating tank or in an adapted chemical mechanical polishing device. A voltage differential is applied to the anode and cathode under a predetermined anodic dissolution current density. This causes a reaction that provides a planarized surface on the metal wafers. Current electrolytic polishing methods generally leave at least 500 Å difference between high and low spots in the wafer surface topography. With the present advanced electrolytic polish, additives are included in the electrolyte solution which adsorb onto the wafer surface urging a higher removal rate at higher spots and a lower removal rate at lower spots. Also, another embodiment of the present invention is a pulsed-electrolytic process in which positive and negative potentials are applied to the anodic and cathodic electrodes alternately, further encouraging surface planarization. A further embodiment of the invention involves using the additive method and the pulsed method in combination.

AEP can be used either as a first step followed by a short mechanical polishing step (buffing) to remove the thin barrier layer (250 Å); or as a second step between an initial CMP polish with about 2000 Å copper layer remaining and a third step mechanical polish. The present invention may also be added as a last step of copper electroplating process and so may be used in the manufacture of all kinds of patterned metal wafers.

With the AEP technique, the "insufficient planarization" problem that occurs in normal CMP processes is substantially eliminated, the first CMP step is much easier, and dishing and erosion caused by the over-polishing step are avoided. AEP eliminates erosion because there is no mechanical action during the AEP process. This is particularly important in processing wafers having high density surface patterns where there is a high potential for erosion. Dishing is greatly decreased with the chemical additives and the pulsed current. The AEP method provides a planarized surface without erosion and with very little dishing.

The present invention together with the above and other advantages may best be understood from the following detailed description of the embodiments of the invention illustrated in the drawings.

DETAILED DESCRIPTION OF PREFERRED EMBODIMENTS

Figure 1:
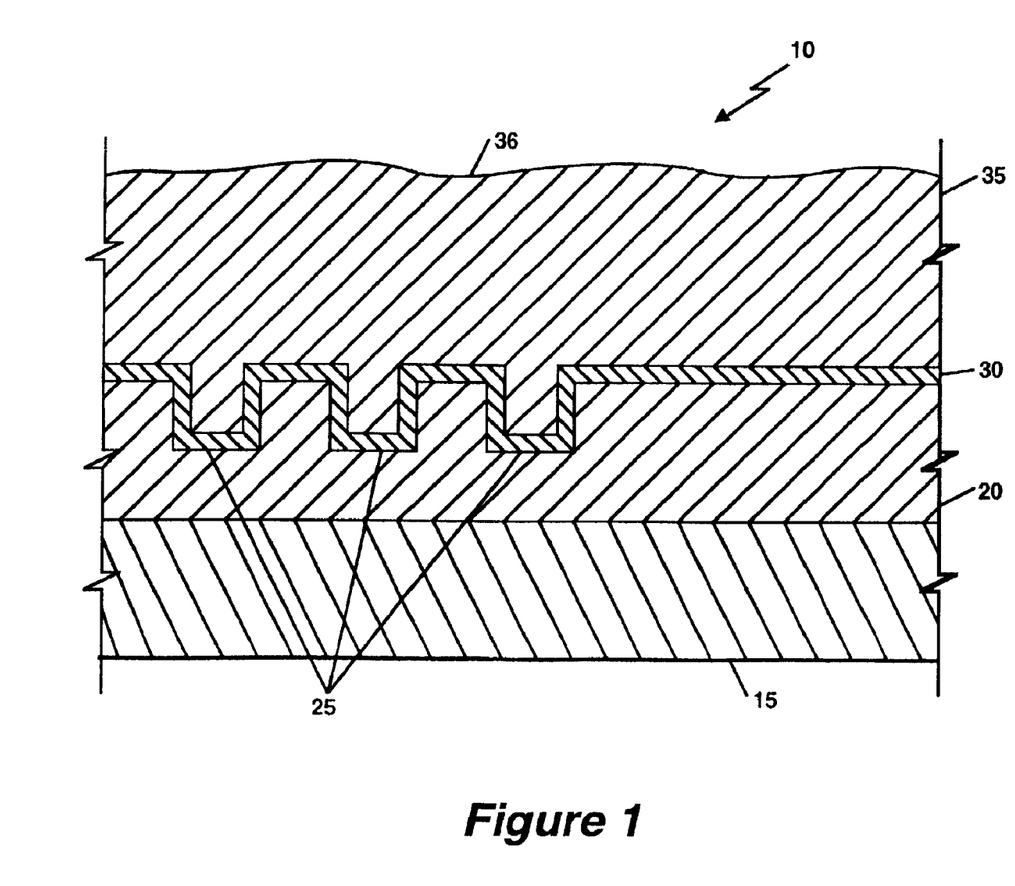
FIG. 1 is a cross-sectional view of a substrate with a plurality of layers.

FIG. 1 shows a cross-sectional view of a conductive substrate 10 having deposited layers such as those layers formed during the manufacture of semiconductors. The figure is not to scale. An interlayer dielectric 20, e.g. silicon oxide, is formed overlying a metal wafer 15. A plurality of indentations, also referred to as openings 25, are formed in a designated area at the left of the interlayer dielectric 20 in which a dense array of conductive lines are to be formed bordering an open field shown on the right of the interlayer dielectric 20. A barrier layer 30, e.g. tantalum, tantalum nitride, titanium or titanium nitride, is deposited on the layer of interlayer dielectric 20, the barrier layer 30 also lining the plurality of openings 25. A conductive layer 35, e.g. copper, is then deposited over the barrier layer 30. The successive layers forms an uneven topography 36 over the substrate which requires planarization before further processing. Also, successive process steps require that portions of the conductive layer be removed. Planarization and selective removal of the conductive layer are accomplished in a polishing step.

Figure 2:
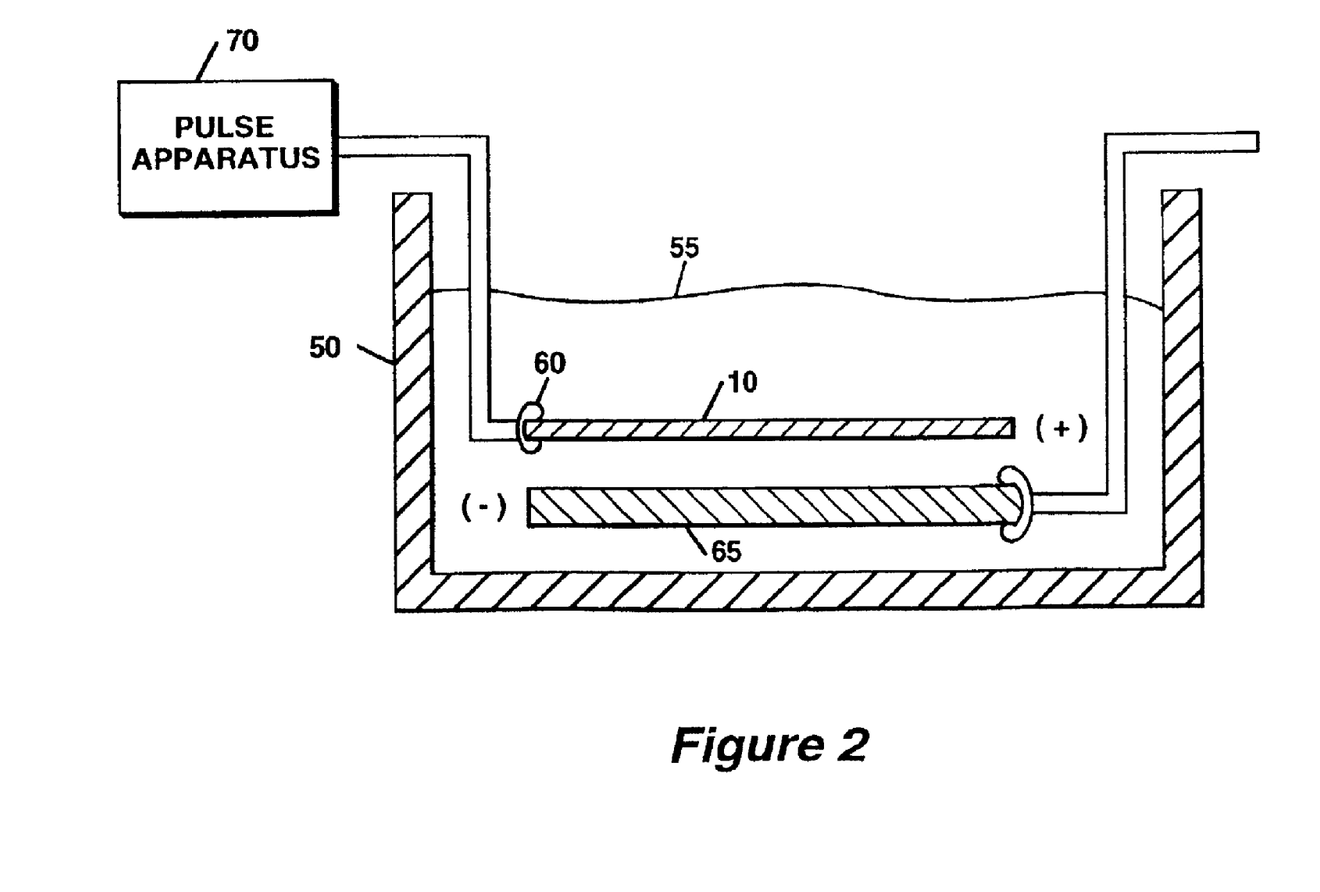
FIG. 2 is a cross-sectional view of a first embodiment of an advanced electrolytic polish device wherein a wafer is immersed in a tank having an electrolyte solution according to principles of the present invention.

FIG. 2 shows a side cross-sectional view of an electrolyzer in a first embodiment of the present invention of advanced electrolytic polishing (AEP). The conductive substrate 10 of FIG. 1 is immersed in a tank 50 containing a solution 55 of electrolytes. The conductive substrate 10 is connected to a conductive clamp 60 to form a first electrode, an anode. A second electrode 65, a cathode matching the metal substrate is also immersed in the tank 50. A voltage differential is applied to the anode and cathode under a predetermined anodic dissolution current density. The current density is typically 1–30 mA/cm$^2$. This causes a reaction that provides a planarized surface on conductive substrates. The reaction stops at the barrier layer, leaving a planarized surface on the substrate having conductive areas and substantially exposed barrier layer. Current electrolytic polishing methods generally leave at least 500 Å difference between high and low spots in the wafer surface topography.

Additives are included in the electrolyte solution which adsorb onto the substrate surface urging a higher removal rate at higher spots and a lower removal rate at lower spots. The additives are generally less than 1% of the electrolyte solution by weight. The additives are surface modifiers. The adsorbed additives act as electric discharge points that modify the surface of the substrate so that high spots are polished first and then low spots are polished. Examples of additives used in this process are coumarin ($C_9H_6O_2$), sulfourea ($CS(NH_2)_2$), and R—$C_6H_5$—O—$(CH_3CH_2O)_n$, where R=$C_8$–$C_9$, and n=10. Other additives and concentrations are possible within the scope of the present invention.

Also, in an alternative embodiment of the present invention, a pulsed-electrolytic process is applied, using a pulse apparatus 70, in which positive and negative potentials are applied between the anodic and cathodic electrodes alternately, further encouraging surface planarization. The pulse apparatus may be an alternator, or a potentiostat with pulsing capability. In this method, a current density typically in the range of 1–30 mA/cm$^2$, for example, is applied typically for a few milliseconds. The pulse-polish modifies the surface of the substrate. Material from high spots on the surface is redeposited to low spots on the surface. This is a useful surface modification in those cases where planarization is not sufficient.

Figure 3:
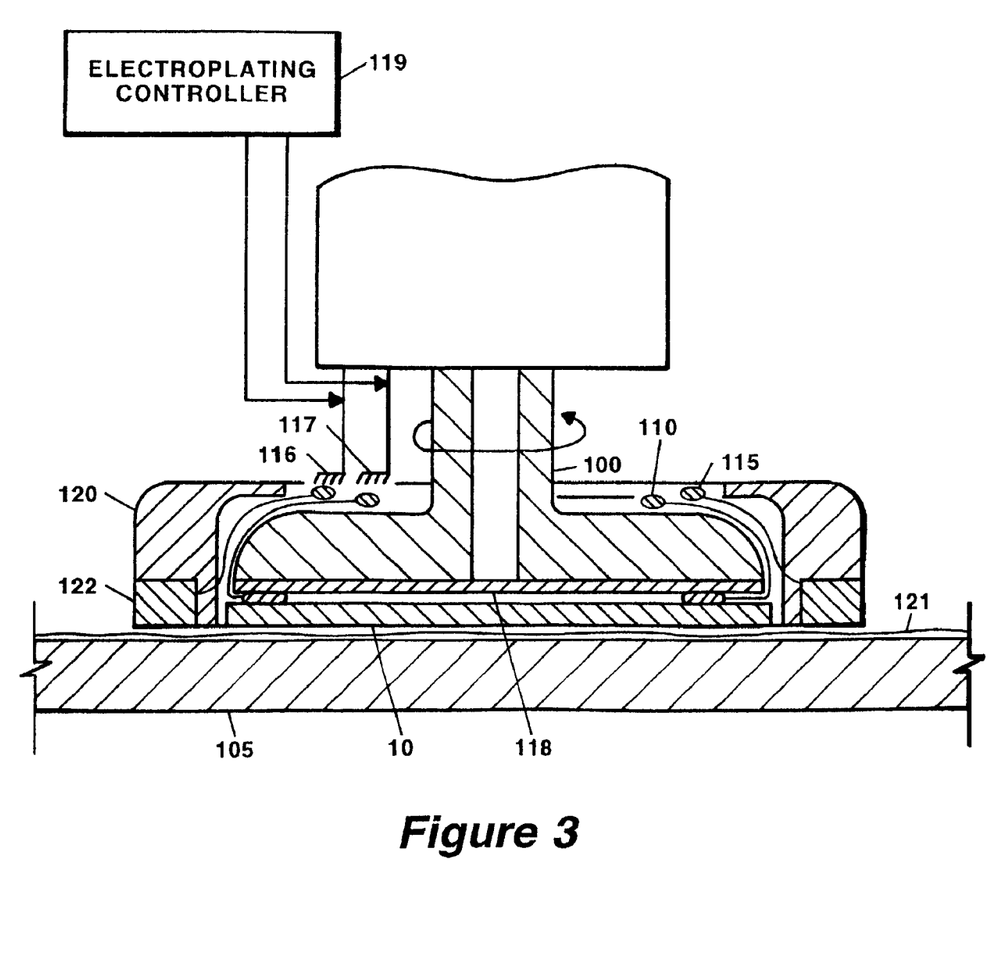
FIG. 3 is a cross-sectional view of a second embodiment of an advanced electrolytic polish device wherein a polishing head contains anodes and a cathode according to principles of the present invention.

FIG. 3 shows a side partial cross-sectional, partial schematic view of an even further embodiment of the present invention of AEP. In FIG. 3, a polish head 100 rests on a polish pad 105 with the metal substrate 10 of FIG. 1 in between the head 100 and the pad 105. An anodic connection 110 and a cathodic connection 115 are provided. The anodic connection contacts the substrate 10 such that the substrate becomes an anode. In the present embodiment of the invention, the anodic 110 and cathodic 115 connections form rings around the head inside the retaining ring 120. A membrane 118 between the polish head and the substrate 10 provides pressure to maintain the contact between the anodic connection 110 and the substrate 10 and between the substrate 10 and polish pad 105. First 116 and second 117 brushes provide electrical connection from connections 110, 115 to an electrolysis controller 119. The electrolysis controller 119 may include a pulse apparatus 70 such as that shown in FIG. 2. A metal portion of the retaining ring 120 acts as a cathode 122. The placement of anodes 110, 115 and the cathode 122 are merely exemplary. Other configurations are possible within the scope of the present invention.

The pad 105 is wetted with electrolyte solution 121. A slurry arm 224 (shown in FIG. 4) having tubes for slurry, in this case for electrolyte solution, extends over the polishing pad 105. A voltage differential is applied to the anode substrate 10 and the cathode 122. This causes a reaction that provides a planarized surface on the conductive substrate. The head 100 spins in order to carry polishing product away from the wafer 10, however, mechanical polishing does not take place. Additives are added to the electrolyte solution with the same effect as described above. No abrasion of the wafer is necessary in order to accomplish the polishing. The pulse polish technique may also be used in this configuration.

Figure 4:
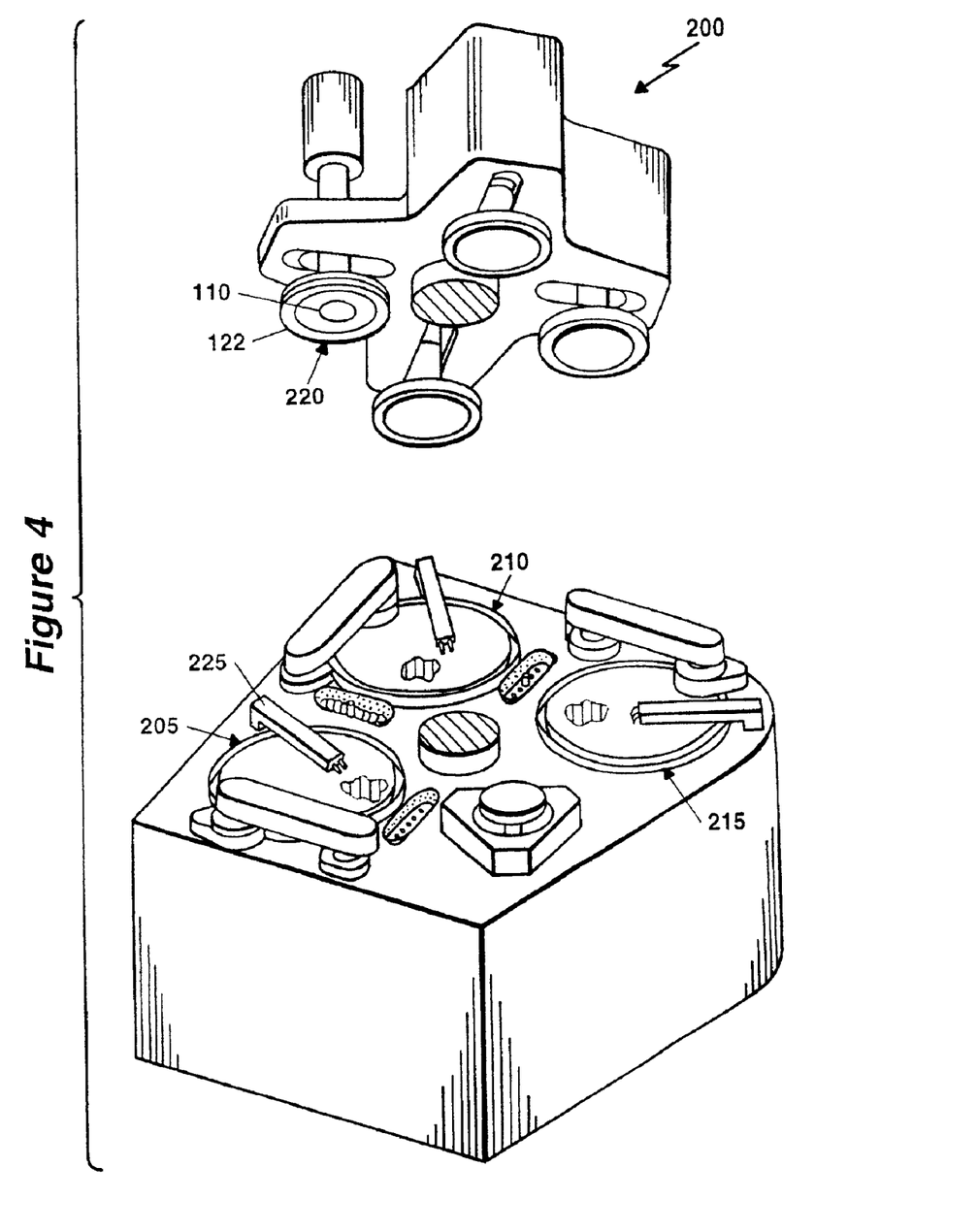
FIG. 4 is a schematic exploded view of a chemical mechanical polishing apparatus.

FIG. 4 shows a chemical mechanical polishing apparatus 200 having a plurality of polishing stations 205, 210, 215. One of the polish heads on the apparatus 200 has modifications as shown in FIG. 3 in order to accomplish the present invention. The head 220 of polishing station 205 has an anodic connection 110, and a cathode 122 as seen in FIG. 3. Slurry arm 225 delivers electrolyte solution to the polishing pad 105. Alternatively, one or more of the polishing stations could be modified with the electrochemical cell shown in FIG. 2 in order to accomplish the present invention.

Figure 5:
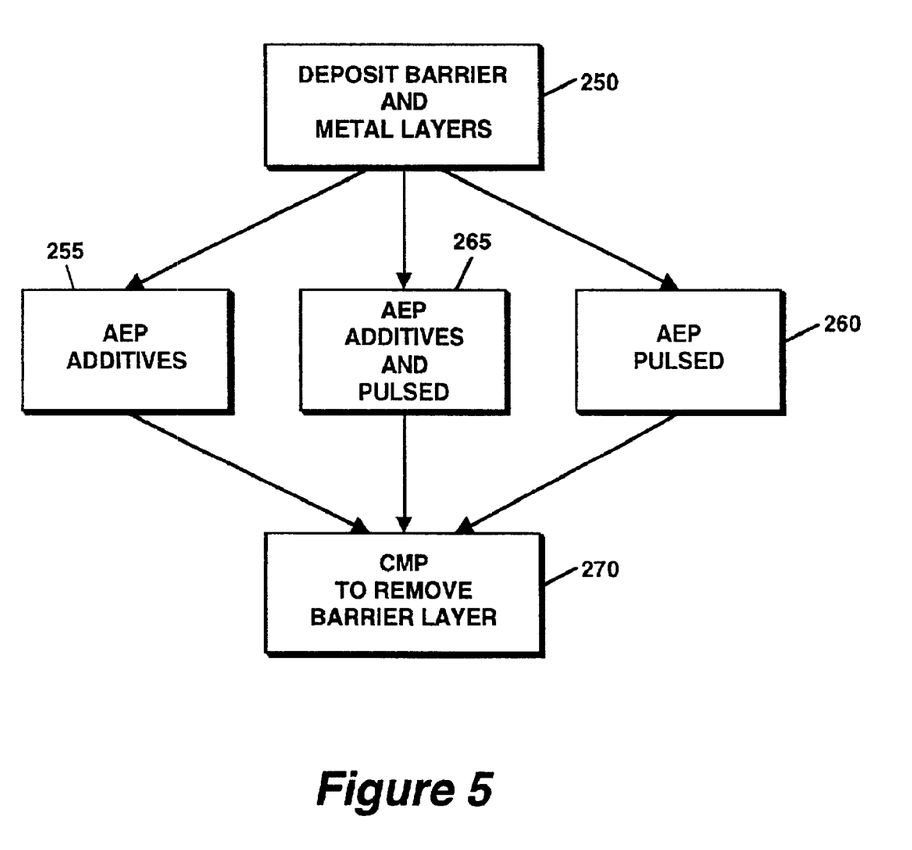
FIG. 5 is a flow chart of a first embodiment of a polishing step using AEP according to principles of the present invention; and, FIG. 6 is a flow chart of a second embodiment of a polishing step using AEP according to principles of the present invention.

FIG. 5 is a flow chart of a first embodiment of a polishing step using AEP according to principles of the present invention. After the barrier layer and the metal layer have been deposited on the wafer, block 250, AEP is applied to planarize the wafer. The planarization may be accomplished by AEP using additives, block 255, AEP using pulsed current, block 260, or AEP using both additives and pulsed current, block 265. Then CMP is applied to the wafer to remove the barrier layer, block 270.

Figure 6:
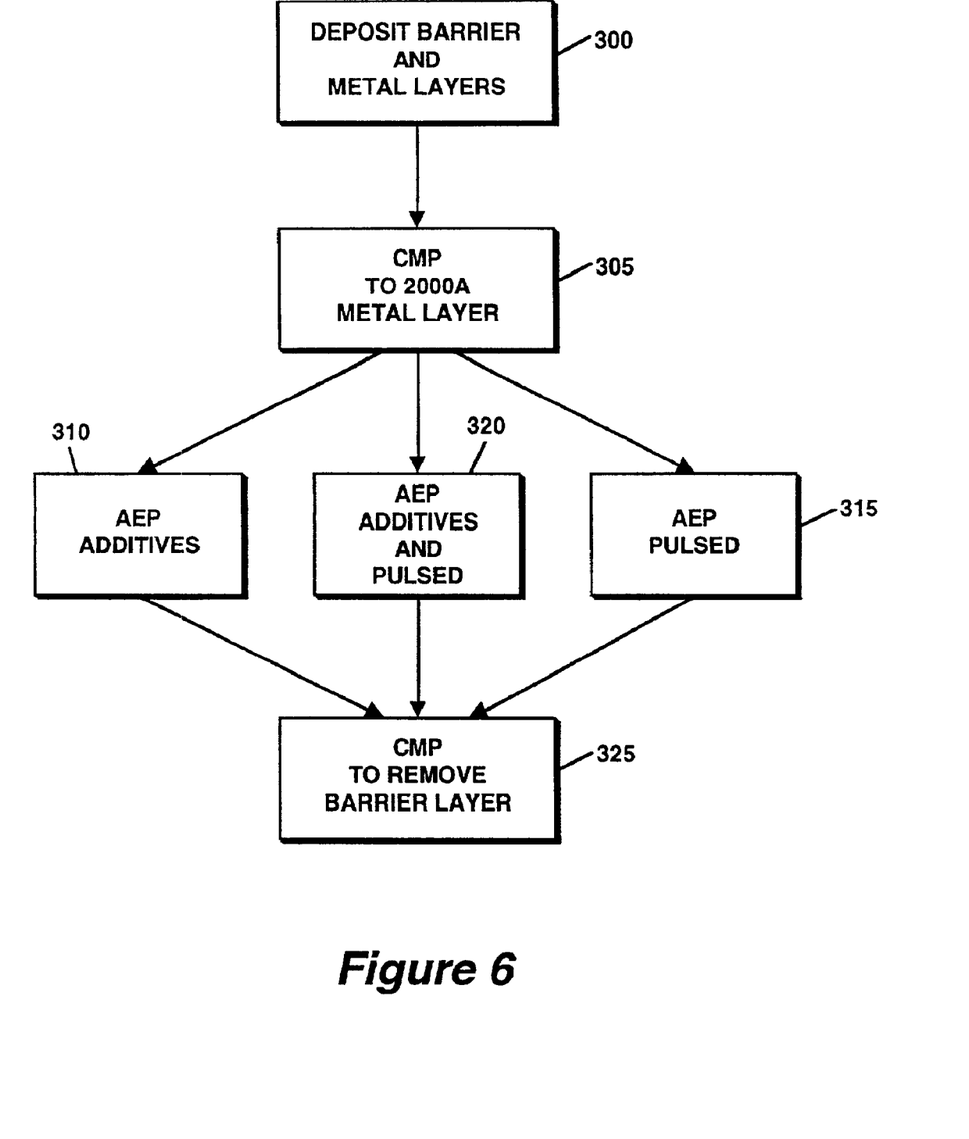

FIG. 6 is a flow chart of a second embodiment of a polishing step using AEP according to principles of the present invention. After the barrier layer and the metal layers have been deposited on the wafer, block 300, CMP is applied, block 305, until a thin film of metal of a predetermined thickness remains, for example 2000 Å. Then AEP is applied to remove the remaining metal and to planarize the surface of the wafer. The AEP process may be AEP using additives, block 310, AEP using pulsed current, block 315, or AEP using both additives and pulsed current, block 320. CMP is then applied to the wafer to remove the barrier layer, block 325.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. A method of polishing a substrate having a metal layer comprising higher spots and lower spots disposed on a barrier layer, the method comprising:

providing an anodic connection to the substrate making the substrate an anode;

providing a cathode;

providing an electrolytic solution in contact with both said anode and said cathode, wherein the electrolyte comprises one or more additives; and providing a potential between the anode and the cathode to remove material at higher removal rates at higher spots on the substrate surface and lower removal rates at lower spots on the substrate surface until the barrier layer is exposed thereby forming a planarized surface on the substrate, wherein providing the potential comprises applying positive and negative potentials alternately between said anode and said cathode.

2. The method of claim 1, wherein said additive is coumarin.

3. The method of claim 1, wherein said additive is sulfourea.

4. The method of claim 1, wherein said positive and negative potentials are applied over periods of milliseconds.

5. The method of claim 1, further comprising:

providing a polishing pad;

providing a polishing slurry disposed between said polishing pad and the surface of the substrate; and polishing the substrate using said polishing pad and slurry until the barrier layer is substantially removed from the planarized surface of the substrate leaving a smooth surface containing selected amounts of conductive surface.

6. A method of polishing a substrate having a metal layer comprising higher spots and lower soots disposed on a barrier layer, the method comprising:

providing an anodic connection to the substrate making the substrate an anode;

providing a cathode;

providing an electrolytic solution in contact with both said anode and said cathode, wherein the electrolyte comprises one or more additives selected from the group consisting of coumarin, sulfourea, $C_8$—$C_6H_5$—O—$(CH_3CH_2O)_{10}$, and $C_9$—$C_6H_5$—O—$(CH_3CH_2O)_{10}$; and providing a potential between the anode and the cathode to remove material at higher removal rates at higher spots on the substrate surface and lower removal rates at lower spots on the substrate surface until the barrier layer is exposed thereby forming a planarized surface on the substrate.

7. The method of claim 6, wherein providing the potential comprises applying positive and negative potentials alternately between said anode and said cathode.

8. The method of claim 7, wherein said positive and negative potentials are applied over periods of milliseconds.

9. A method of polishing a substrate, said substrate having a barrier layer below a conductive layer, comprising:

providing an anodic connection to the substrate making the substrate an anode;

providing a cathode;

providing an electrolyte solution in contact with both said anode and said cathode, said electrolyte solution containing an additive to urge higher removal rates at higher spots on the substrate surface and lower removal rates at lower spots on the substrate surface;

providing current to said anode to remove material from said anode until the barrier layer is exposed thereby forming a planarized surface on the substrate;

providing a polishing pad;

providing a polishing slurry disposed between said polishing pad and the surface of the substrate; and polishing the substrate using said polishing pad, abrasive, and slurry until the barrier layer is substantially removed from the planarized surface of the substrate leaving a smooth surface containing selected amounts of conductive surface.

10. A method of polishing a substrate having a metal layer, comprising:

exposing the substrate to an electrolyte solution comprising one or more additives, wherein the metal layer comprises higher spots and lower spots;

adsorbing the additives on the metal layer;

applying a bias between a first electrode coupled to the substrate and a second electrode; and removing conductive material from higher spots at a greater removal rate than conductive material from lower spots.

11. The method of claim 10, wherein the additives are selected from the group of coumarin, sulfourea, $C_8-C_6H_5-O-(CH_3CH_2O)_{10}$, and $C_9-C_6H_5-O-(CH_3CH_2O)_{10}$.

12. The method of claim 10, wherein the additives comprise less than 1% of the electrolyte solution.

13. The method of claim 10, wherein applying the bias comprises applying positive and negative potentials alternately between the first electrode and the second electrode.

14. The method of claim 13, wherein said positive and negative potentials are applied over periods of milliseconds.

15. The method of claim 10, wherein the bias is applied at a current density in the range of 1 $mA/cm^2$ to 30 $mA/cm^2$ to the surface of the substrate.

16. The method of claim 10, further comprising chemical mechanical polishing the substrate.

17. The method of claim 10, further comprising polishing the substrate by a chemical mechanical polishing technique to remove a portion of the metal layer prior to exposing the substrate to the electrolyte solution.

18. A method of polishing a substrate having a metal layer, comprising:

positioning the substrate in an apparatus containing a first electrode and a second electrode;

coupling the substrate to the first electrode;

exposing the substrate to an electrolyte solution comprising one or more additives selected from the group of coumarin, sulfourea, $C_8-C_6H_5-O-(CH_3CH_2O)_{10}$, and $C_9-C_6H_5-O-(CH_3CH_2O)_{10}$, wherein the metal layer comprises higher spots and lower spots;

adsorbing the additives on the metal layer;

applying a pulsed bias between the first electrode and the second electrode; and removing conductive material from higher spots at a greater removal rate than conductive material from lower spots.

19. The method of claim 18, wherein the additives comprise less than 1% of the electrolyte solution.

20. The method of claim 18, wherein the bias is applied at a current density in the range of 1 $mA/cm^2$ to 30 $mA/cm^2$ to the surface of the substrate.

21. The method of claim 18, further comprising chemical mechanical polishing the substrate until the barrier layer is substantially removed from the planarized surface of the substrate.

22. The method of claim 18, further comprising polishing the substrate by a chemical mechanical polishing technique to remove a portion of the metal layer prior to exposing the substrate to the electrolyte solution.

23. A method of polishing a substrate having a metal layer, comprising:

positioning the substrate in an apparatus containing a polishing station having a first electrode and a second electrode;

exposing the substrate to an electrolyte solution comprising one or more additives, wherein the substrate comprises higher spots and lower spots;

adsorbing the additives on the substrate surface;

applying a bias between the first electrode and the second electrode;

removing conductive material from higher spots at a greater removal rate than conductive material from lower spots; and then polishing the substrate by a chemical mechanical polishing technique.

24. The method of claim 23, wherein the additives are selected from the group of coumarin, sulfourea, $C_8-C_6H_5-O-(CH_3CH_2O)_{10}$, and $C_9-C_6H_5-O-(CH_3CH_2O)_{10}$.

25. The method of claim 23, wherein the additives comprise less than 1% of the electrolyte solution.

26. The method of claim 23, Wherein the bias comprises a pulsed bias.

27. The method of claim 26, wherein the pulsed bias comprises applying positive and negative potentials alternately between the first electrode and the second electrode over periods of milliseconds.

28. The method of claim 23, wherein the bias is applied at a current density in the range of 1 $mA/cm^2$ to 30 $mA/cm^2$ to the surface of the substrate.

29. The method of claim 23, wherein polishing the substrate comprises substantially removing the metal layer by a chemical mechanical polishing technique prior to exposing the substrate to an electrolyte solution comprising one or more additives.

30. The method of claim 23, wherein the chemical mechanical polishing technique is performed on a second polishing station having a polishing pad.

* * * * *

UNITED STATES PATENT AND TRADEMARK OFFICE
CERTIFICATE OF CORRECTION

PATENT NO.       : 7,077,725 B2
APPLICATION NO.  : 09/949275
DATED            : July 18, 2006
INVENTOR(S)      : Sun et al.

It is certified that error appears in the above-identified patent and that said Letters Patent is hereby corrected as shown below:

Column 6, Claim 6, Line 32: Change "soots" to --spots--

Column 8, Claim 26, Line 39: Change "Wherein" to --wherein--

Signed and Sealed this

Second Day of January, 2007

JON W. DUDAS
*Director of the United States Patent and Trademark Office*